US012313664B2

(12) United States Patent
Huang

(10) Patent No.: US 12,313,664 B2
(45) Date of Patent: May 27, 2025

(54) CAPACITANCE MEASUREMENT CIRCUIT

(71) Applicant: Elite Semiconductor Microelectronics Technology Inc., Hsinchu (TW)

(72) Inventor: Yi-Chou Huang, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 178 days.

(21) Appl. No.: 18/235,356

(22) Filed: Aug. 18, 2023

(65) Prior Publication Data
US 2025/0060398 A1 Feb. 20, 2025

(51) Int. Cl.
*G01R 27/26* (2006.01)
*G01D 5/24* (2006.01)

(52) U.S. Cl.
CPC ........... *G01R 27/2605* (2013.01); *G01D 5/24* (2013.01)

(58) Field of Classification Search
CPC ........ G01R 27/00; G01R 27/02; G01R 27/26; G01R 27/2605; G01D 5/00; G01D 5/12; G01D 5/14; G01D 5/24; G01D 5/2403; G01D 5/2405; G01D 5/241; G01D 5/2412; G01D 5/2417
USPC ................ 324/600, 649, 658, 661, 663, 686
See application file for complete search history.

(56) References Cited

U.S. PATENT DOCUMENTS

| | | | |
|---|---|---|---|
| 8,890,618 B2 * | 11/2014 | Pamarti | H03F 1/56 330/124 R |
| 10,817,114 B2 | 10/2020 | Sasai | |
| 11,320,452 B2 * | 5/2022 | Hu | G01P 15/0802 |
| 12,092,672 B2 * | 9/2024 | Huang | G01R 27/2605 |
| 2018/0011125 A1 | 1/2018 | Oshima | |
| 2020/0408805 A1 * | 12/2020 | Hu | G01P 15/18 |
| 2023/0408565 A1 * | 12/2023 | Sasai | G01R 35/005 |

FOREIGN PATENT DOCUMENTS

| | | |
|---|---|---|
| CN | 116670529 A | 8/2023 |
| TW | 201140256 A1 | 11/2011 |

* cited by examiner

*Primary Examiner* — Hoai-An D. Nguyen
(74) *Attorney, Agent, or Firm* — Winston Hsu

(57) ABSTRACT

A capacitance measurement circuit includes a charge to voltage converter (CVC) that includes at least one first variable capacitor, an excitation signal generation circuit, a differential amplifier, a first switch circuit, and at least one second variable capacitor, wherein a parasitic capacitance from a sensing capacitance sensed by a capacitance sensor is reduced by the at least one first variable capacitor. The excitation signal generation circuit is arranged to generate and connect a first excitation signal to the capacitance sensor, and generate and connect a second excitation signal to the at least one first variable capacitor, wherein the first excitation signal and the second excitation signal are out-of-phase, and a voltage amplitude of the first excitation signal is different from a voltage amplitude of the second excitation signal. The inverting input terminal of the differential amplifier is arranged to receive the sensing capacitance from the capacitance sensor.

17 Claims, 5 Drawing Sheets

CAPACITANCE MEASUREMENT CIRCUIT

BACKGROUND OF THE INVENTION

1. Field of the Invention

The present invention is related to capacitance measurement, and more particularly, to a capacitance to digital converter (CDC) and a charge to voltage converter (CVC) therein.

2. Description of the Prior Art

For a capacitance measurement circuit (e.g. a CDC including a CVC and a voltage to digital converter (e.g. an analog to digital converter (ADC))), a variable capacitor within the CVC may be utilized to reduce/cancel a parasitic capacitance from a sensing capacitance of a capacitor to be measured, or adjust an input dynamic range for following signal conversion, wherein the capacitor to be measured is sensed by a charge conversion circuit of a CDC front-end circuit. However, if the parasitic capacitance is much larger than a capacitance of the variable capacitor, it may be unable to reduce/cancel the parasitic capacitance through the variable capacitor. Under a condition that the parasitic capacitance is too large to be reduced/cancelled, a voltage amplitude of an output voltage of the CVC may exceed an input voltage range of the ADC, which results in the ADC unable to operate normally.

SUMMARY OF THE INVENTION

It is therefore one of the objectives of the present invention to provide a capacitance measurement circuit that can generate multiple excitation signals with different voltage amplitudes to an external capacitance sensor and at least one internal compensation capacitor, respectively, to address the above-mentioned issues.

According to an embodiment of the present invention, a capacitance measurement circuit is provided. The capacitance measurement circuit may include a CVC. The CVC may include at least one first variable capacitor, an excitation signal generation circuit, a differential amplifier, a first switch circuit, and at least one second variable capacitor, wherein a parasitic capacitance from a sensing capacitance sensed by a capacitance sensor is reduced by the at least one first variable capacitor. The excitation signal generation circuit may be arranged to generate and connect a first excitation signal to a first terminal of the capacitance sensor, and generate and connect a second excitation signal to the at least one first variable capacitor, wherein the first excitation signal and the second excitation signal are out-of-phase, and a voltage amplitude of the first excitation signal is different from a voltage amplitude of the second excitation signal. The differential amplifier has an inverting input terminal, a non-inverting input terminal, an inverting output terminal, and a non-inverting output terminal, wherein the inverting input terminal is arranged to receive the sensing capacitance from a second terminal of the capacitance sensor, the first switch circuit is coupled between the inverting input terminal and the non-inverting output terminal of the differential amplifier, and the first switch circuit and the at least second variable capacitor are connected in parallel at the inverting input terminal and the non-inverting output terminal of the differential amplifier.

In addition, the CVC may be arranged to generate an output voltage according to the sensing capacitance. The capacitance measurement circuit may be a CDC, and further include an analog to digital converter (ADC), wherein the ADC may be arranged to convert the output voltage into a digital pulse stream.

One of the benefits of the present invention is that, the capacitance measurement circuit (which includes a CVC and an ADC) of the present invention can generate multiple excitation signals with different voltage amplitudes to an external capacitance sensor and at least one compensation capacitor in the CVC, respectively. Under a condition that a parasitic capacitance included in a sensing capacitance of a capacitor to be measured being much larger than a capacitance of the at least one compensation capacitor, the CVC of the present invention can successfully reduce/cancel the parasitic capacitance by the at least one compensation capacitor due to the excitation signals with different voltage amplitudes. In this way, a voltage amplitude of an output voltage of the CVC will not exceed an input dynamic range of the ADC, which can make the ADC operate properly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
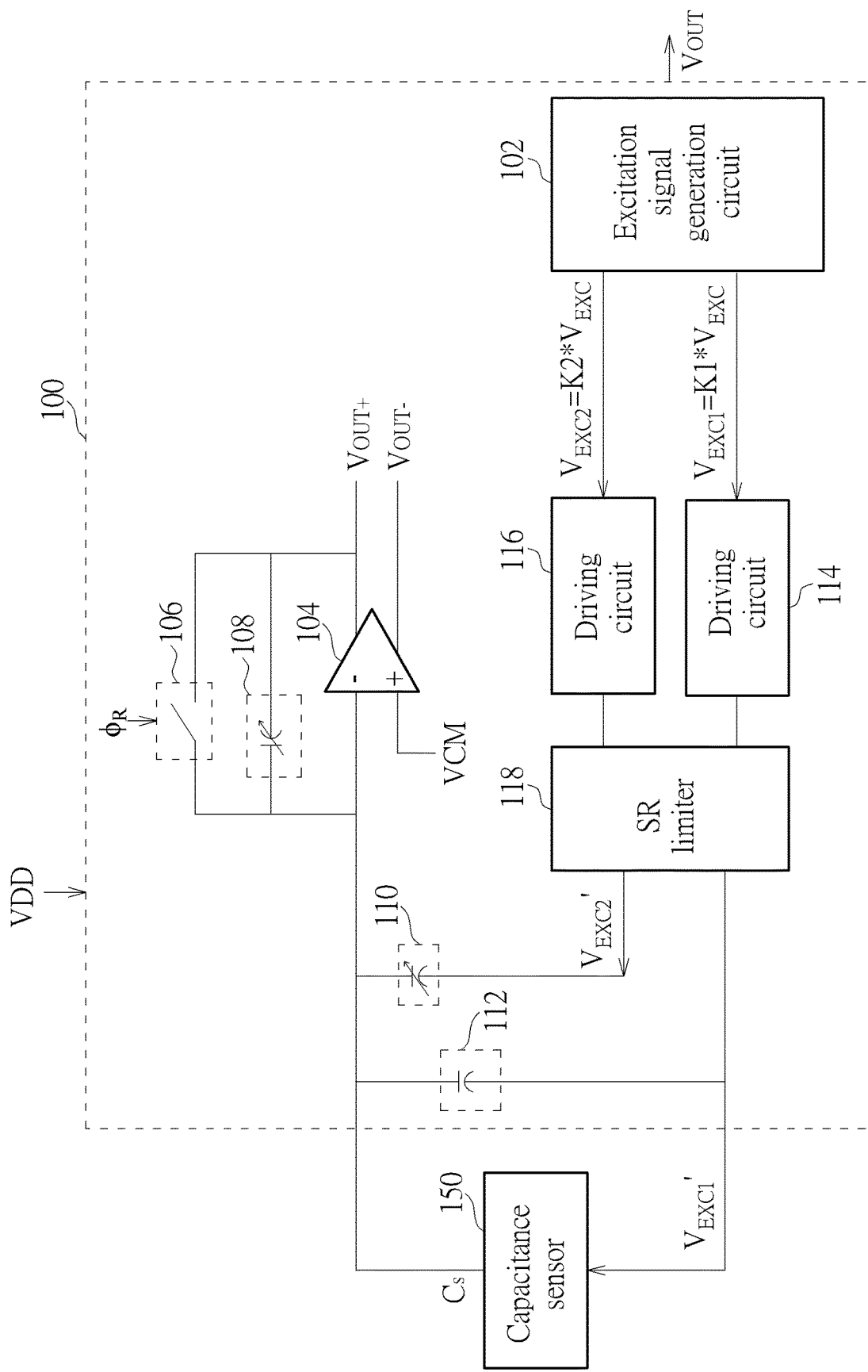
FIG. 1 is a diagram illustrating a charge to voltage converter according to a first embodiment of the present invention.

FIG. 1 is a diagram illustrating a charge to voltage converter (CVC) 100 according to a first embodiment of the present invention. As shown in FIG. 1, the CVC 100 may include an excitation signal generation circuit 102, a differential amplifier 104, a switch circuit 106, at least one variable capacitor 108, at least one compensation capacitor 110, a self-calibration capacitor 112, multiple driving circuits 114 and 116, and a slew rate (SR) limiter 118, wherein a supply voltage VDD may be supplied to the CVC 100, and the least one compensation capacitor 110 may be at least one variable capacitor. In addition, there is a capacitance sensor 150 external to the CVC 100, wherein the capacitance sensor 150 has two-terminal connection architecture, and may be arranged to sense a sensing capacitance $C_S$. The capacitance sensor 150 may act as a variable component where the dynamic range of the sensing capacitance $C_S$ will be changed according to the external environment. The CVC 100 may be arranged to generate an output voltage $V_{OUT}$ (which may be a differential output resulting from $V_{OUT+}$ and $V_{OUT-}$) according to the sensing capacitance $C_S$. For example, the sensing capacitance $C_S$ may include an actual capacitance to be measured (for brevity, denoted by "$C_S$'")

and a parasitic capacitance $C_P$ (i.e. $C_S = C_S' + C_P$), wherein the at least one compensation capacitor 110 may be arranged to reduce/cancel the parasitic capacitance $C_P$ from the sensing capacitance $C_S$. In addition, under a condition that the capacitance sensor 150 is not coupled to the CVC 100 (i.e. no capacitor to be measured), the CVC 100 may suffer from floating connection. To address this issue, the self-calibration capacitor 112 may be arranged to perform a self-calibration operation for the CVC 100.

The excitation signal generation circuit 102 may be arranged to generate a first excitation signal $V_{EXC1}$ and connect the first excitation signal $V_{EXC1}$ to a first terminal of the capacitance sensor 150 through the driving circuit 114 and the SR limiter 118, and generate a second excitation signal $V_{EXC2}$ and connect the second excitation signal $V_{EXC2}$ to the at least one compensation capacitor 110 through the driving circuit 116 and the SR limiter 118, wherein the first excitation signal $V_{EXC1}$ and the second excitation signal $V_{EXC2}$ are out-of-phase and non-overlapping, and a voltage amplitude of the first excitation signal $V_{EXC1}$ is different from that of the second excitation signal $V_{EXC2}$. More particularly, the voltage amplitude of the first excitation signal $V_{EXC1}$ is lower than that of the second excitation signal $V_{EXC2}$. For better comprehension, the first excitation signal $V_{EXC1}$ may be K1 times as large as an excitation voltage signal $V_{EXC}$ (i.e. $V_{EXC1} = K1 * V_{EXC}$), and the second excitation signal $V_{EXC2}$ may be K2 times as large as the excitation voltage signal $V_{EXC}$ (i.e. $V_{EXC2} = K2 * V_{EXC}$). For example, under a condition that the parasitic capacitance $C_P$ is much larger than a capacitance of the at least one compensation capacitor 110, the voltage amplitude of the first excitation signal $V_{EXC1}$ may be set to be lower than that of the second excitation signal $V_{EXC2}$ (i.e. K1<K2) by the excitation signal generation circuit 102.

Figure 2:
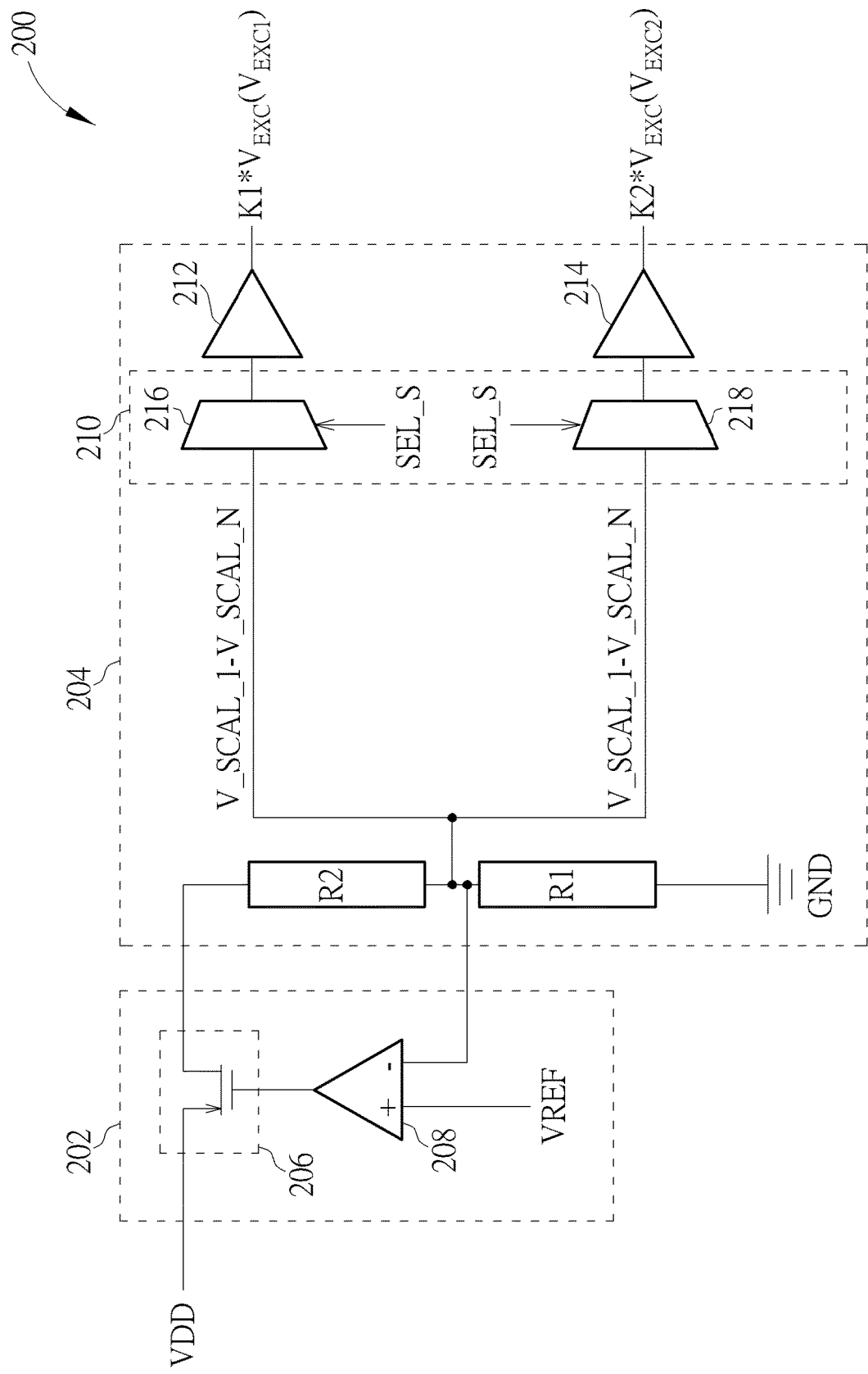
FIG. 2 is a diagram illustrating an excitation signal generation circuit according to an embodiment of the present invention.

In detail, please refer to FIG. 2. FIG. 2 is a diagram illustrating an excitation signal generation circuit 200 according to an embodiment of the present invention, wherein the excitation signal generation circuit 102 shown in FIG. 1 may be implemented by the excitation signal generation circuit 200. As shown in FIG. 2, the excitation signal generation circuit 200 may include a low dropout (LDO) regulator 202 and a scaling circuit 204. The LDO regulator 202 may be arranged to regulate the supply voltage VDD to generate the excitation voltage signal $V_{EXC}$ (i.e. an input and an output of the LDO regulator 202 are the supply voltage VDD and the excitation voltage signal $V_{EXC}$, respectively), and may include a P-type transistor 206 and an amplifier 208, wherein the excitation voltage signal $V_{EXC}$ may be a square wave with a frequency value in a frequency range from 32 kHz to 500 KHz (e.g. a square wave with 32 KHz), a high voltage level (denoted by "$V_{EXC+}$") of the excitation voltage signal $V_{EXC}$ is different from the supply voltage VDD, and a low voltage level (denoted by "$V_{EXC-}$") of the excitation voltage signal $V_{EXC}$ is different from or equal to a ground voltage GND. The P-type transistor 206 has a source terminal coupled to the supply voltage VDD and a drain terminal coupled to the scaling circuit 204. The amplifier 208 has an inverting input terminal (labeled as "−" in FIG. 2), a non-inverting input terminal (labeled as "+" in FIG. 2), and an output terminal, wherein the non-inverting input terminal is coupled to a reference voltage VREF, the inverting input terminal is coupled to the scaling circuit 204, and the output terminal is coupled to a gate terminal of the P-type transistor 206. The excitation voltage $V_{EXC}$ is output from the drain terminal of the P-type transistor 206 to the scaling circuit 204.

The scaling circuit 204 may be arranged to perform multiple scaling operations upon the excitation voltage signal $V_{EXC}$, to generate the first excitation signal $V_{EXC1}$ and the second excitation signal $V_{EXC2}$. Specifically, the scaling circuit 204 may include multiple resistors R1 and R2, a selection circuit 210, and multiple buffers 212 and 214, wherein the first excitation signal $V_{EXC1}$ and the second excitation signal $V_{EXC2}$ may be generated through a configuration between the resistor R1, the resistor R2, and the selection circuit 210. The resistor R1 has a first terminal coupled to the ground voltage GND and a second terminal coupled to the inverting input terminal of the amplifier 208. The resistor R2 has a first terminal coupled to the second terminal of the resistor R1 and a second terminal coupled to the drain terminal of the P-type transistor 206. The selection circuit 210 is coupled to the first terminal of the resistor R2. By changing a ratio between resistance values of the resistors R1 and R2, a plurality of scaled voltages V_SCAL_1-V_SCAL_N (which include the first excitation signal $V_{EXC1}$ and the second excitation signal $V_{EXC2}$) can be obtained by the selection circuit 210, wherein N is an integer greater than 1 (i.e. N>1). For example, setting parameters of the scaled voltages V_SCAL_1-V_SCAL_N may be stored in a register (not shown), and the selection circuit 210 may be arranged to select one of the scaled voltages V_SCAL_1-V_SCAL_N from the register for each of the first excitation signal $V_{EXC1}$ and the second excitation signal $V_{EXC2}$.

The selection circuit 210 may include multiple N-to-1 multiplexers (MUXs; e.g. multiple MUXs 216 and 218), wherein the MUX 216 may be arranged to receive the scaled voltages V_SCAL_1-V_SCAL_N and output one of the scaled voltages V_SCAL_1-V_SCAL_N (e.g. the first excitation signal $V_{EXC1}$) to the buffer 212 according to a selection signal SEL_S, the MUX 218 may be arranged to receive the scaled voltages V_SCAL_1-V_SCAL_N and output one of the scaled voltages V_SCAL_1-V_SCAL_N (e.g. the second excitation signal $V_{EXC2}$) to the buffer 214 according to the selection signal SEL_S, and the selection signal SEL_S may be indicative of a ratio between the voltage amplitudes of the first excitation signal $V_{EXC1}$ and the second excitation signal $V_{EXC2}$ (i.e. a ratio between K1 and K2). For example, under a condition that the selection signal SEL_S indicates that the ratio between K1 and K2 is 8 (e.g. K2=8*K1), the selection circuit 210 may select and output a scaled voltage that is equal to K1*$V_{EXC}$ from the scaled voltages V_SCAL_1-V_SCAL_N and output the scaled voltage to the buffer 212, and select another scaled voltage that is equal to 8*K1*$V_{EXC}$ from the scaled voltages V_SCAL_1-V_SCAL_N and output the another scaled voltage to the buffer 214.

The buffer 212 may be arranged to receive the first excitation signal $V_{EXC1}$ from the selection circuit 210 (more particularly, the MUX 216), and connect the first excitation signal $V_{EXC1}$ to a first terminal of the capacitance sensor 150 through the driving circuit 114 and the SR limiter 118. The buffer 214 may be arranged to receive the second excitation signal $V_{EXC2}$ from the selection circuit 210 (more particularly, the MUX 218), and connect the second excitation signal $V_{EXC2}$ to the at least one compensation capacitor 110 through the driving circuit 116 and the SR limiter 118.

Refer back to FIG. 1. Since the scaled voltages (e.g. the first excitation signal $V_{EXC1}$ and the second excitation signal $V_{EXC2}$) may have a poor driving ability, the driving circuit 114 may be arranged to receive the first excitation signal $V_{EXC1}$ from the excitation signal generation circuit 102/200 (more particularly, the buffer 212), and drive the capacitance sensor 150 according to the first excitation signal $V_{EXC1}$.

The driving circuit 116 may be arranged to receive the second excitation signal $V_{EXC2}$ from the excitation signal generation circuit 102/200 (more particularly, the buffer 214), and drive the at least one compensation capacitor 110 according to the second excitation signal $V_{EXC2}$. In this embodiment, each of the driving circuits 114 and 116 is a push-pull driver, wherein the push-pull driver is a digital driving circuit composed of a P-type transistor in series with an N-type transistor, but the present invention is not limited thereto. In some embodiments, each of the driving circuits 114 and 116 may include multiple switches (e.g. multiple transmission gates). In some embodiments, the driver circuits 114 and 116 may be a combination of a push-pull driver and switches, wherein one of the driving circuits 114 and 116 may be a push-pull driver, and another of the driving circuits 114 and 116 may include the transmission gates.

Under a condition that the first excitation signal $V_{EXC1}$ and the second excitation signal $V_{EXC2}$ are directly connected from the driving circuits 114 and 116 to the capacitance sensor 150 and the at least one compensation capacitor 110, respectively, the square wave will rise and fall sharply between the high voltage level and the low voltage level, which may cause the electromagnetic interference (EMI) and interfere the electronic components nearby. To solve this issue, the SR limiter 118 may be arranged to perform a slew rate limitation operation upon the first excitation signal $V_{EXC1}$ and the second excitation signal $V_{EXC2}$, respectively, to generate and connect a first limited excitation signal $V_{EXC1}'$ to the first terminal of the capacitance sensor 150, and generate and connect a second limited excitation signal $V_{EXC2}'$ to the at least one compensation capacitor 110.

The differential amplifier 104 has an inverting input terminal (labeled as "−" in FIG. 1), a non-inverting input terminal (labeled as "+" in FIG. 1), a non-inverting output terminal (i.e. a terminal from which a first differential output voltage $V_{OUT+}$ is output), and an inverting output terminal (i.e. a terminal from which a second differential output voltage $V_{OUT-}$ is output), wherein the inverting input terminal may be coupled to the at least one compensation capacitor 110, the self-calibration capacitor 112, and the capacitance sensor 150, and may be arranged to receive the sensing capacitance $C_S$ from a second terminal of the capacitance sensor 150, the non-inverting input terminal may be coupled to a common-mode voltage (labeled as "VCM" in FIG. 1), and the output voltage $V_{OUT}$ is a voltage difference between the inverting output terminal and the non-inverting output terminal of the differential amplifier 104 (i.e. $V_{OUT}=V_{OUT+}-V_{OUT-}$). The switch circuit 106 may be coupled between the inverting input terminal and the non-inverting output terminal of the differential amplifier 104, wherein the switch circuit 106 is controlled by a control signal that is in-phase with the first excitation signal $V_{EXC1}$ (i.e. the control signal and the second excitation signal $V_{EXC2}$ are out-of-phase). For example, the control signal may be a clock signal $\Phi_R$, wherein the clock signal $\Phi_R$ may be a square wave with a frequency value in a frequency range from 32 kHz to 500 KHz (e.g. a square wave with 32 KHz), a high voltage level of the clock signal $\Phi_R$ may be the supply voltage VDD, and a low voltage level of the clock signal $\Phi_R$ may be the ground voltage GND.

In this embodiment, it is assumed that in response to the clock signal $\Phi_R$ being at the high voltage level (e.g. the supply voltage VDD), the switch circuit 106 is closed (i.e. switched on), and in response to the clock signal $\Phi_R$ being at the low voltage level (i.e. the ground voltage GND), the switch circuit 106 is open (i.e. switched off). In addition, the switch circuit 106 and the at least one variable capacitor 108 may be connected in parallel at the inverting input terminal and the non-inverting output terminal of the differential amplifier 104. In addition, the at least one compensation capacitor 110 may have multiple capacitances to be selected. For example, the at least one compensation capacitor 110 can be configured as a certain value (e.g. a capacitance selected from the multiple capacitances) that is equal to or close to the parasitic capacitance $C_P$, to perform parasitic capacitance reduction/cancellation according to the second excitation signal $V_{EXC2}$. By a configuration between the differential amplifier 104, the switch circuit 106, and the at least one variable capacitor 108, the output voltage $V_{OUT}$ can be obtained by the following equation:

$$V_{OUT} = \frac{(V_{EXC1} * C_S) - (V_{EXC2} * C_{DAC})}{C_i}$$

Wherein $V_{EXC1}$ is the voltage amplitude of the first excitation signal $V_{EXC1}$, $C_S$ is the sensing capacitance $C_S$, $V_{EXC2}$ is the voltage amplitude of the second excitation signal $V_{EXC2}$, $C_{DAC}$ is a capacitance of the at least one compensation capacitor 110, and $C_i$ is a capacitance of the at least one variable capacitor 108.

In addition, under a case that the first excitation signal $V_{EXC1}$ is K1 times as large as the excitation voltage signal $V_{EXC}$ (i.e. $V_{EXC1}=K1*V_{EXC}$), and the second excitation signal $V_{EXC2}$ is K2 times as large as the excitation voltage signal $V_{EXC}$ (i.e. $V_{EXC2}=K2*V_{EXC}$), the above equation can be simplified as follows:

$$V_{OUT} = \frac{V_{EXC} * [(K1 * C_S) - (K2 * C_{DAC})]}{C_i}$$

wherein $V_{EXC}$ is the voltage amplitude of the excitation voltage signal $V_{EXC}$. Under a condition that the parasitic capacitance $C_P$ from the sensing capacitance $C_S$ is much larger than (e.g. 10 times) the capacitance of the at least one compensation capacitor 110, K2 can be set to be 10 times as large as K1 (e.g. K2=10*K1) by the excitation signal generation circuit 102/200. In this way, the parasitic capacitance $C_P$ can be successfully reduced/canceled by the at least one compensation capacitor 110.

Figure 3:
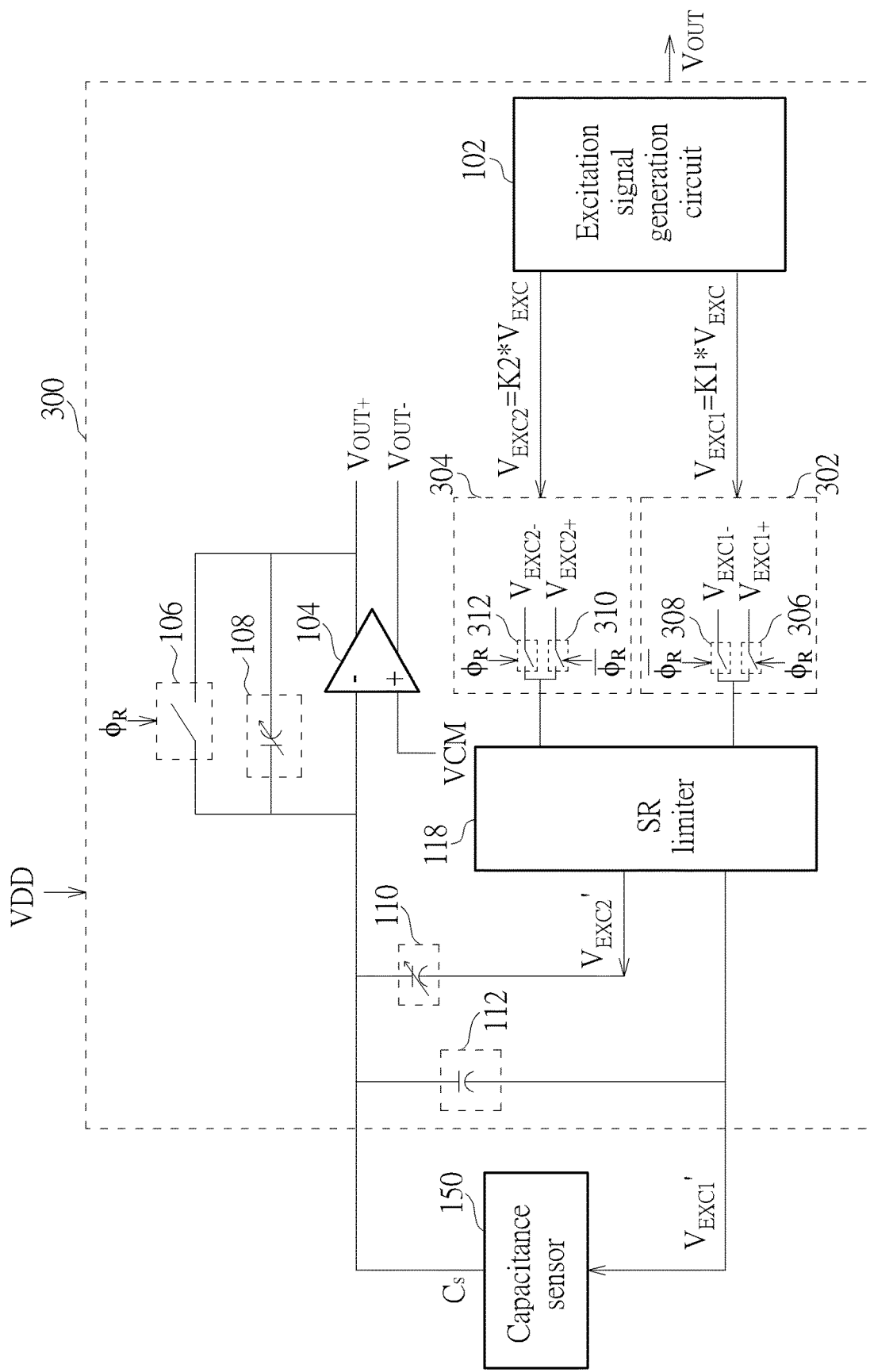
FIG. 3 is a diagram illustrating a charge to voltage converter according to a second embodiment of the present invention.

FIG. 3 is a diagram illustrating a CVC 300 according to a second embodiment of the present invention. The difference between the CVC 300 shown in FIG. 3 and the CVC 100 shown in FIG. 1 is that the driving circuits 114 and 116 of the CVC 100 are modified to be implemented by driving circuits 302 and 304 of the CVC 300, respectively. When the voltage level of the scaled voltage (e.g. the first excitation signal $V_{EXC1}$) is getting lower than a threshold voltage level of the P-type transistor and/or the N-type transistor, the P-type transistor and/or the N-type transistor in the push-pull driver may not be able to operate normally, which causes the push-pull driver to work abnormally and fail to be equipped with the driving capability. To address this issue, multiple switches (e.g. multiple transmission gates) that are not affected by the voltage level of the scaled voltage are embedded in each of the driving circuits 302 and 304 of the CVC 300.

Specifically, the driving circuit 302 may include multiple switch circuits 306 and 308. The switch circuit 306 has a first terminal and a second terminal, wherein the first terminal of the switch circuit 306 is arranged to receive a high voltage level of the first excitation signal $V_{EXC1}$ (denoted by "$V_{EXC1+}$") from the excitation signal generation circuit 102, and the switch circuit 306 is controlled by a control signal that is in-phase with the first excitation signal $V_{EXC1}$ (e.g. the clock signal $\Phi_R$), for connecting the high voltage level of the first excitation signal $V_{EXC1}$ to the second terminal of the switch circuit 306. It is assumed that in response to the clock signal $\Phi_R$ being at the high voltage level (i.e. the first excitation signal $V_{EXC1}$ is also at the high voltage level), the switch circuit 306 is closed (i.e. switched on), and in response to the clock signal $\Phi_R$ being at the low voltage level (i.e. the first excitation signal $V_{EXC1}$ is also at the low voltage level), the switch circuit 306 is open (i.e. switched off).

The switch circuit 308 has a first terminal and a second terminal, wherein the first terminal of the switch circuit 308 is arranged to receive a low voltage level of the first excitation signal $V_{EXC1}$ (denoted by "$V_{EXC1-}$") from the excitation signal generation circuit 102, and the switch circuit 308 is controlled by a control signal $\overline{\Phi_R}$ that is out-of-phase with the first excitation signal $V_{EXC1}$, for connecting the low voltage level of the excitation signal $V_{EXC1}$ to the second terminal of the switch circuit 308. It is assumed that in response to the control signal $\overline{\Phi_R}$ being at the high voltage level (i.e. the first excitation signal $V_{EXC1}$ is at the low voltage level), the switch circuit 308 is closed (i.e. switched on), and in response to the control signal $\overline{\Phi_R}$ being at the low voltage level (i.e. the first excitation signal $V_{EXC1}$ is at the high voltage level), the switch circuit 308 is open (i.e. switched off). The capacitance sensor 150 is coupled to the second terminal of the switch circuit 306 and the second terminal of the switch circuit 308 through the SR limiter 118.

The driving circuit 304 may include multiple switch circuits 310 and 312. The switch circuit 310 has a first terminal and a second terminal, wherein the first terminal of the switch circuit 310 is arranged to receive a high voltage level of the second excitation signal $V_{EXC2}$ (denoted by "$V_{EXC2+}$") from the excitation signal generation circuit 102, and the switch circuit 310 is controlled by a control signal that is out-of-phase with the first excitation signal $V_{EXC1}$ (e.g. the control signal $\overline{\Phi_R}$), for connecting the high voltage level of the second excitation signal $V_{EXC2}$ to the second terminal of the switch circuit 310. It is assumed that in response to the control signal $\overline{\Phi_R}$ being at the high voltage level (i.e. the second excitation signal $V_{EXC2}$ is also at the high voltage level), the switch circuit 310 is closed (i.e. switched on), and in response to the control signal $\overline{\Phi_R}$ being at the low voltage level (i.e. the second excitation signal $V_{EXC2}$ is also at the low voltage level), the switch circuit 310 is open (i.e. switched off).

The switch circuit 312 has a first terminal and a second terminal, wherein the first terminal of the switch circuit 312 is arranged to receive a low voltage level of the second excitation signal $V_{EXC2}$ (denoted by "$V_{EXC2-}$") from the excitation signal generation circuit 102, and the switch circuit 312 is controlled by a control signal that is in-phase with the first excitation signal $V_{EXC1}$ (e.g. the clock signal $\Phi_R$), for connecting the low voltage level of the second excitation signal $V_{EXC2}$ to the second terminal of the switch circuit 312. It is assumed that in response to the clock signal $\Phi_R$ being at the high voltage level (i.e. the second excitation signal $V_{EXC2}$ is at the low voltage level), the switch circuit 312 is closed (i.e. switched on), and in response to the clock signal $\Phi_R$ being at the low voltage level (i.e. the second excitation signal $V_{EXC2}$ is at the high voltage level), the switch circuit 312 is open (i.e. switched off). The at least one compensation capacitor 110 is coupled to the second terminal of the switch circuit 310 and the second terminal of the switch circuit 312 through the SR limiter 118.

Figure 4:
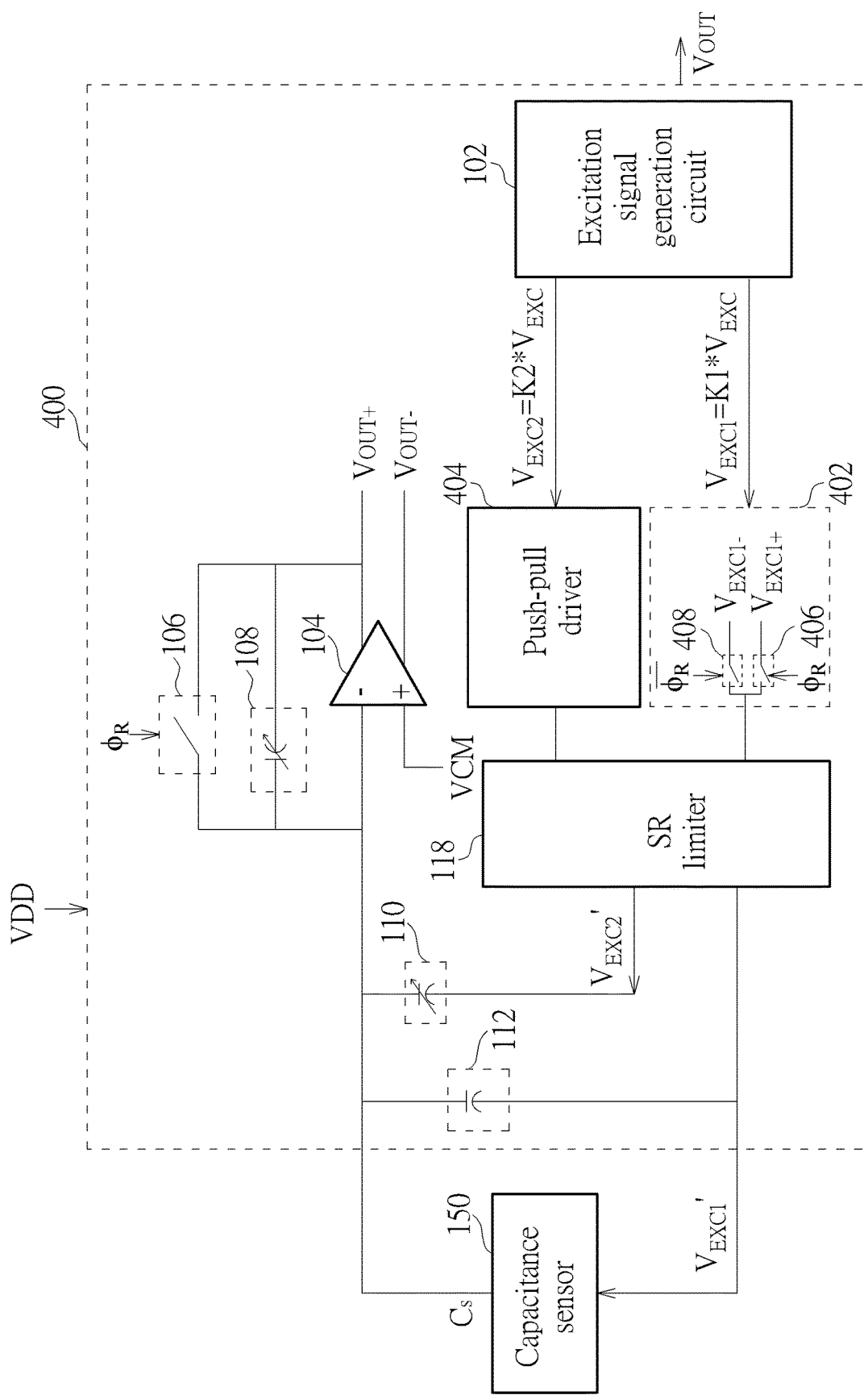
FIG. 4 is a diagram illustrating a charge to voltage converter according to a third embodiment of the present invention.

FIG. 4 is a diagram illustrating a CVC 400 according to a third embodiment of the present invention. The difference between the CVC 400 shown in FIG. 4 and the CVC 100 shown in FIG. 1 is that the driving circuits 114 and 116 of the CVC 100 are modified to be implemented by driving circuits 402 and 404 of the CVC 400, respectively. In this embodiment, a scaling range (e.g. a reduction range) corresponding to the first excitation signal $V_{EXC1}$ is too small so that the voltage level of the first excitation signal $V_{EXC1}$ is not large enough to drive a push-pull driver, and the second excitation signal VEXC2 can still drive a push-pull driver normally. To address this issue, the driving circuit 402 includes multiple switches (e.g. multiple transmission gates, such as multiple switch circuits 406 and 408) that are not affected by the voltage level of the scaled voltage, and the driving circuit 404 is still implemented by a push-pull driver. Since a person skilled in the pertinent art can readily understand details of operations of the CVC 400 after reading above paragraphs directed to the CVC 100 shown in FIG. 1 and the CVC 300 shown in FIG. 3, further descriptions are omitted here for brevity.

Figure 5:
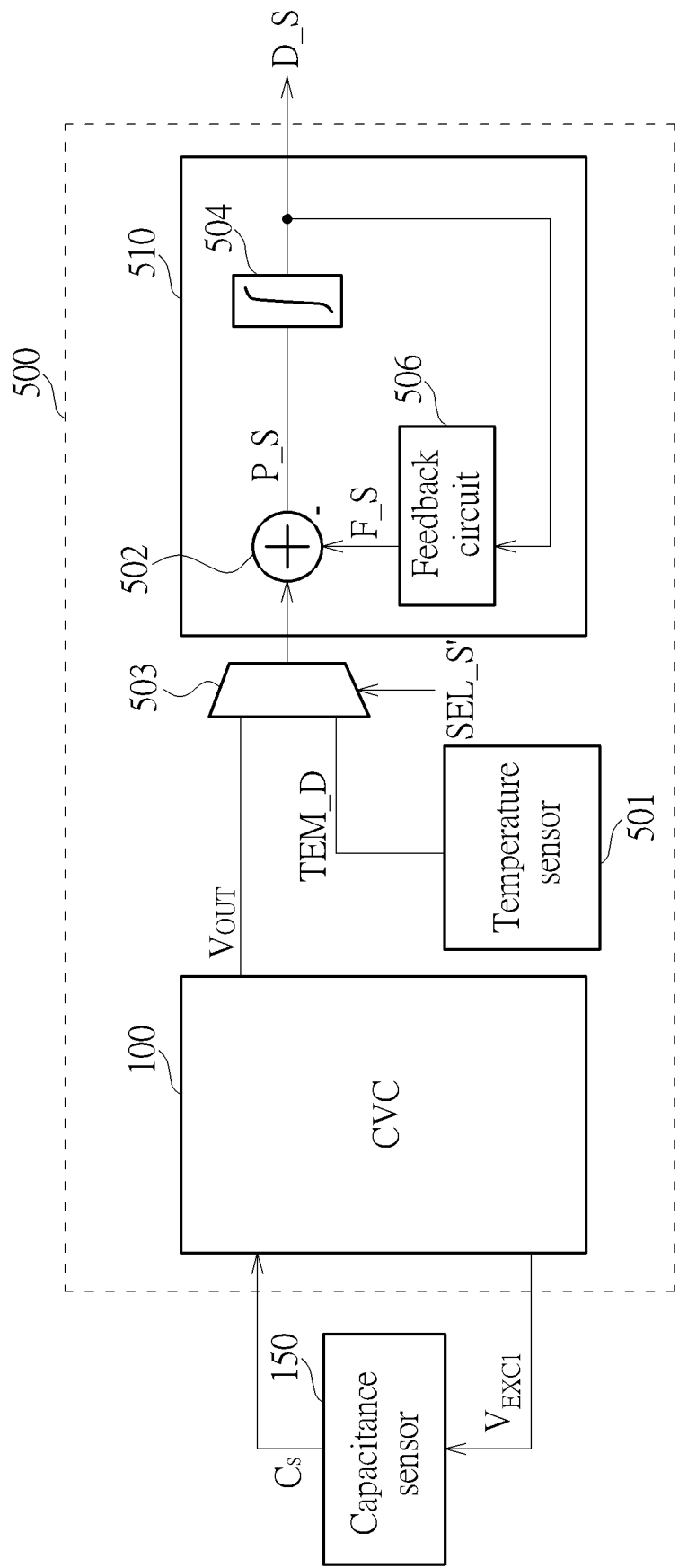
FIG. 5 is a diagram illustrating a capacitance measurement circuit according to an embodiment of the present invention.

FIG. 5 is a diagram illustrating a capacitance measurement circuit 500 according to an embodiment of the present invention, wherein the capacitance measurement circuit 500 is a capacitance to digital converter (CDC). As shown in FIG. 5, the capacitance measurement circuit 500 may at least include the CVC 100 shown in FIG. 1 and an analog to digital converter (ADC) 510, and further include a temperature sensor 501 and a 2-to-1 MUX (e.g. a MUX 503), wherein the ADC 510 may be arranged to convert the output voltage $V_{OUT}$ into a digital pulse stream D_S. In this embodiment, the ADC 510 is a sigma-delta ADC, but the present invention is not limited thereto. In practice, any ADC architecture that is capable of converting the output voltage $V_{OUT}$ into the digital pulse stream D_S may be employed by the ADC 510. These alternative designs all fall within the scope of the present invention.

In addition, since the dynamic range of the sensing capacitance $C_S$ may be changed according to the external environment, the temperature sensor 501 may be arranged to sense environment temperature to generate temperature data TEM_D. The MUX 503 may be arranged to receive the output voltage $V_{OUT}$ from the CVC 100, receive the temperature data TEM_D from the temperature sensor 501, and output one of the output voltage $V_{OUT}$ and the temperature data TEM_D to the ADC 510 according to a selection signal SEL_S', wherein the sensing capacitance $C_S$ may be fine-tuned according to the temperature data TEM_D by the ADC 510.

The ADC 510 may at least include a subtraction circuit 502, an integrator circuit 504, and a feedback circuit 506. The subtraction circuit 502 may be arranged to receive the output voltage $V_{OUT}$ from the CVC 100 (more particularly, the subtraction circuit 114), and subtract a feedback signal F_S from the output voltage $V_{OUT}$, to generate a processed signal P_S. The integrator circuit 504 may be coupled to the subtraction circuit 502, and may be arranged to integrate the processed signal P_S to generate the digital pulse stream D_S. The feedback circuit 506 may be coupled to the integrator circuit 504 and the subtraction circuit 502, and may be arranged to derive the feedback signal F_S from the digital pulse stream D_S, and transmit the feedback signal F_S to the subtraction circuit 502. Since the sigma-delta ADC is well known to those skilled in the art, the details of the ADC 510 will be omitted here for brevity.

In summary, the capacitance measurement circuit (which includes a CVC and an ADC) of the present invention can generate multiple excitation signals with different voltage amplitudes to an external capacitance sensor and at least one compensation capacitor in the CVC, respectively. Under a condition that a parasitic capacitance included in a sensing capacitance of a capacitor to be measured being much larger than a capacitance of the at least one compensation capacitor, the CVC of the present invention can successfully reduce/cancel the parasitic capacitance by the at least one compensation capacitor due to the excitation signals with different voltage amplitudes. In this way, voltage amplitude of an output voltage of the CVC will not exceed an input voltage range of the ADC, which can make the ADC operate normally.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitance measurement circuit, comprising:
   a charge to voltage converter (CVC), comprising:
      at least one first variable capacitor, wherein a parasitic capacitance from a sensing capacitance sensed by a capacitance sensor is reduced by the at least one first variable capacitor;
      an excitation signal generation circuit, arranged to generate and connect a first excitation signal to a first terminal of the capacitance sensor, and generate and connect a second excitation signal to the at least one first variable capacitor, wherein the first excitation signal and the second excitation signal are out-of-phase, and a voltage amplitude of the first excitation signal is different from a voltage amplitude of the second excitation signal;
      a differential amplifier, having an inverting input terminal, a non-inverting input terminal, an inverting output terminal, and a non-inverting output terminal, wherein the inverting input terminal is arranged to receive the sensing capacitance from a second terminal of the capacitance sensor;
      a first switch circuit, coupled between the inverting input terminal and the non-inverting output terminal of the differential amplifier; and
      at least one second variable capacitor, wherein the first switch circuit and the at least second variable capacitor are connected in parallel at the inverting input terminal and the non-inverting output terminal of the differential amplifier.

2. The capacitance measurement circuit of claim 1, wherein the voltage amplitude of the first excitation signal is lower than the voltage amplitude of the second excitation signal.

3. The capacitance measurement circuit of claim 1, wherein the excitation signal generation circuit comprises:
   a low dropout (LDO) regulator, arranged to regulate a supply voltage to generate an excitation voltage signal, wherein the supply voltage is supplied to the CVC; and
   a scaling circuit, arranged to perform multiple scaling operations upon the excitation voltage signal, to generate and connect the first excitation signal to the first terminal of the capacitance sensor, and generate and connect the second excitation signal to the at least one first variable capacitor.

4. The capacitance measurement circuit of claim 3, wherein the LDO regulator comprises:
   a P-type transistor, having a source terminal coupled to the supply voltage and a drain terminal coupled to the scaling circuit; and
   an amplifier, having an inverting input terminal, a non-inverting input terminal, and an output terminal, wherein the non-inverting input terminal is coupled to a first reference voltage, the inverting input terminal is coupled to the scaling circuit, and the output terminal is coupled to a gate terminal of the P-type transistor;
   wherein the excitation voltage signal is output from the drain terminal of the P-type transistor to the scaling circuit.

5. The capacitance measurement circuit of claim 4, wherein the scaling circuit comprises:
   a first resistor, having a first terminal coupled to a second reference voltage and a second terminal coupled to the inverting input terminal of the amplifier;
   a second resistor, having a first terminal coupled to the second terminal of the first resistor and a second terminal coupled to the drain terminal of the P-type transistor; and
   a selection circuit, coupled to the first terminal of the second resistor;
   wherein the first excitation signal and the second excitation signal are generated through a configuration between the first resistor, the second resistor, and the selection circuit.

6. The capacitance measurement circuit of claim 5, wherein the scaling circuit further comprises:
   a first buffer, arranged to receive the first excitation signal from the selection circuit, and connect the first excitation signal to the first terminal of the capacitance sensor; and
   a second buffer, arranged to receive the second excitation signal from the selection circuit, and connect the second excitation signal to the at least one first variable capacitor.

7. The capacitance measurement circuit of claim 1, wherein the CVC further comprises:
   a first driving circuit, arranged to receive the first excitation signal from the excitation signal generation circuit, and drive the capacitance sensor according to the first excitation signal; and
   a second driving circuit, arranged to receive the second excitation signal from the excitation signal generation circuit, and drive the at least one first variable capacitor according to the second excitation signal.

8. The capacitance measurement circuit of claim 7, wherein each of the first driving circuit and the second driving circuit is a push-pull driver.

9. The capacitance measurement circuit of claim 7, wherein each of the first driving circuit and the second driving circuit comprises multiple switches.

10. The capacitance measurement circuit of claim 9, wherein the first driving circuit comprises:
    a second switch circuit, having a first terminal and a second terminal, wherein the first terminal of the second switch circuit is arranged to receive a high voltage level of the first excitation signal from the excitation signal generation circuit, the second switch circuit is controlled by a first control signal for connecting the high voltage level of the first excitation signal to the second terminal of the second switch circuit, and the first control signal and the first excitation signal are in-phase; and a third switch circuit, having a first terminal and a second terminal, wherein the first terminal of the third switch circuit is arranged to receive a low voltage level of the first excitation signal from the excitation signal generation circuit, the third switch circuit is controlled by a second control signal for connecting the low voltage level of the excitation signal to the second terminal of the third switch circuit, and the second control signal and the first excitation signal are out-of-phase;

wherein the first terminal of the capacitance sensor is coupled to the second terminal of the second switch circuit and the second terminal of the third switch circuit.

11. The capacitance measurement circuit of claim 9, wherein the second driving circuit comprises:
 a second switch circuit, having a first terminal and a second terminal, wherein the first terminal of the second switch circuit is arranged to receive a high voltage level of the second excitation signal from the excitation signal generation circuit, the second switch circuit is controlled by a first control signal for connecting the high voltage level of the second excitation signal to the second terminal of the second switch circuit, and the first control signal and the first excitation signal are out-of-phase; and
 a third switch circuit, having a first terminal and a second terminal, wherein the first terminal of the third switch circuit is arranged to receive a low voltage level of the second excitation signal from the excitation signal generation circuit, the third switch circuit is controlled by a second control signal for connecting the low voltage level of the second excitation signal to the second terminal of the third switch circuit, and the second control signal and the first excitation signal are in-phase;
 wherein the at least one first variable capacitor is coupled to the second terminal of the second switch circuit and the second terminal of the third switch circuit.

12. The capacitance measurement circuit of claim 7, wherein one of the first driving circuit and the second driving circuit is a push-pull driver, and another of the first driving circuit and the second driving circuit comprises multiple switches.

13. The capacitance measurement circuit of claim 12, wherein the first driving circuit comprises the multiple switches, and the second driving circuit is the push-pull driver.

14. The capacitance measurement circuit of claim 1, wherein the CVC further comprises:
 a slew rate limiter, arranged to perform a slew rate limitation operations upon the first excitation signal and the second excitation signal, to generate a first limited excitation signal and a second limited excitation signal, respectively.

15. The capacitance measurement circuit of claim 1, wherein the CVC further comprises:
 a self-calibration capacitor, arranged to perform a self-calibration operation for the CVC.

16. The capacitance measurement circuit of claim 1, wherein the CVC is arranged to generate an output voltage according to the sensing capacitance; and the capacitance measurement circuit is a capacitance to digital converter (CDC), and further comprises:
 an analog to digital converter (ADC), arranged to convert the output voltage into a digital pulse stream.

17. The capacitance measurement circuit of claim 16, wherein the ADC is a sigma-delta ADC, and the sigma-delta ADC at least comprises:
 a subtraction circuit, arranged to receive the output voltage from the CVC, and subtract a feedback signal from the output voltage, to generate a processed signal;
 an integrator circuit, coupled to the subtraction circuit, and arranged to integrate the processed signal to generate the digital pulse stream; and
 a feedback circuit, coupled to the integrator circuit and the subtraction circuit, and arranged to derive the feedback signal from the digital pulse stream, and transmit the feedback signal to the subtraction circuit.

\* \* \* \* \*